(12) United States Patent
Kitamura et al.

(10) Patent No.: US 6,434,013 B2
(45) Date of Patent: Aug. 13, 2002

(54) ELECTRONIC CIRCUIT BOARD CASE

(75) Inventors: Nobuyuki Kitamura; Satoshi Kikuchi, both of Takanezawa-machi (JP)

(73) Assignee: Keihin Corporation, Tokyo (JP)

( * ) Notice: Subject to any disclaimer, the term of this patent is extended or adjusted under 35 U.S.C. 154(b) by 0 days.

(21) Appl. No.: 09/790,500

(22) Filed: Feb. 23, 2001

(30) Foreign Application Priority Data

Feb. 24, 2000 (JP) ........................................ 2000-048013

(51) Int. Cl.⁷ ................................................. H05K 5/06
(52) U.S. Cl. ...................... 361/752; 361/796; 361/801; 361/797; 439/76.2; 174/52.2; 174/50
(58) Field of Search .................................. 361/752, 726, 361/740, 753, 796, 797, 801, 833; 174/35 R, 76, 52.2, 50, 50.5, 51; 439/716.2

(56) References Cited

FOREIGN PATENT DOCUMENTS

| JP | 62-95897 | 5/1987 |
| JP | 6-243919 | 9/1994 |
| JP | 8-167455 | 6/1996 |
| JP | 10-22312 | 1/1998 |

Primary Examiner—David Martin
Assistant Examiner—Hung Bui
(74) Attorney, Agent, or Firm—Armstrong, Westerman & Hattori, LLP

(57) ABSTRACT

A case for an electronic circuit board mounted with electronic components having a case main body whose one end is opened, an opening formed at an outer periphery of the open end of the case main body; and retaining means such as rails, projections, recess for retaining the electronic circuit board inserted through the open end at a prescribed position in the case main body. With this, the electronic circuit board can be immobilized at the prescribed position in the case main body and the strength of the case (i.e. case main body), particularly the strength of the open end thereof, can be increased. Moreover, when resin is potted in the case main body, any resin that runs out from the open end can be caused to flow into the opening.

5 Claims, 6 Drawing Sheets

ELECTRONIC CIRCUIT BOARD CASE

BACKGROUND OF THE INVENTION

1. Field of the Invention

This invention relates to an electronic circuit board case, particularly to a case for accommodating an electronic circuit board mounted with electronic components wherein resin is potted or charged into the space between the accommodated electronic circuit board and the inner wall of the case to immobilize and protect the electronic circuit board.

2. Description of the Related Art

An electronic circuit board mounted on a motorcycle or vehicle or the like must be protected from electronic component lead breakage and pattern exfoliation caused by shock and vibration imparted thereto from the exterior and also from corrosion and shortcircuiting defects caused by water immersion and moisture invasion. The electronic circuit board is therefore accommodated in a case and resin is potted or charged into the space between the electronic circuit board and the inner wall of the case to immobilize and protect the electronic circuit board.

FIG. 5 is a sectional view of a conventional electronic circuit board case.

A case 10 shown in FIG. 5, more specifically, a case main body 12 of the case, accommodates an electronic circuit board 16 inserted therein through an open end 14 at the top of the case. Connectors 18 and other electronic components are mounted on the electronic circuit board 16. (Electronic components other than the connectors 18 are omitted from the drawing.)

After accommodation of the electronic circuit board 16 has been completed, resin 20 is potted or charged into the space between the inner wall of the case main body 12 and the electronic circuit board 16. The resin 20 is potted or charged up to a level near the open end 14, more specifically up to a level where the cured resin 20 can retain (immobilize) and protect the electronic circuit board 16 and the connectors 18.

Further, Japanese Laid-open Patent Application No. Sho 62(1987)-95897, for example, teaches insertion of the electronic circuit board into the case after the case has been potted or charged with resin.

Since it is a property of the resin 20 to undergo a temporary decrease in viscosity during curing, the resin can penetrate even into the fine regions of the space between the case main body 12 and both the electronic circuit board 16 and electronic components. On the other hand, when the resin 20 is potted or charged to the foregoing level, it moves into the space between the case main body 12 and the connectors 18 owing to capillary action, overflows the open end 14 of the case main body 12, and runs out to the exterior.

This will be explained in further detail with reference to FIG. 6. Capillary action arising at a gap portion 22 between the case main body 12 and the connectors 18 causes the resin 20 to move toward the portions indicated by A and B in FIGS. 5, i.e., toward the portions where the case main body 12 and the connectors 18 are in contact (as indicated by the arrows in FIG. 6). The resin 20 then overflows the open end 14 in the vicinity of A and B and runs out to the exterior of the case 10.

The overflowing resin 20 sticks to the outside of the case main body 12 and spoils its appearance. Extra processing, such as a wiping step, has therefore been necessary.

Conventional practices for preventing outflow of the resin 20 include sealing the places where the resin 20 flows out by application of an adhesive or the like or potting or charging the resin 20 with the case 10 tilted about 15 degrees in the direction of the arrow in FIG. 5 so as to prevent potting or charging of resin into the portions that give rise to capillary action. Although these techniques are effective for preventing outflow of the resin 20, they do not help to prevent an increase in the number of fabrication steps.

On the other hand, when the electronic circuit board is inserted into the case after it has been potted or charged with resin, the resin is apt to overflow at the time of inserting the electronic circuit board.

When the case is used in an environment where it is exposed to shock and vibration, moreover, the strength of the case, particularly the strength of the open end thereof, is preferably increased. In addition, it is preferable to be able to retain (immobilize) the accommodated electronic circuit board and electronic components with high reliability.

Although Japanese Laid-open Patent Application Nos. Sho 62 (1987)-95897, Hei 10 (1998)-22312, Hei 8 (1996)-167455 and Hei 6 (1994)-243919, among others, teach techniques for resolving the foregoing issues, none solves them all.

SUMMARY OF THE INVENTION

An object of this invention is therefore to provide an electronic circuit board case that, without requiring any increase in number of fabrication steps, can prevent sticking of resin to the case exterior, is enhanced in strength, particularly the strength of the open end, and can reliably retain (immobilize) and protect an accommodated electronic circuit board and electronic components.

For realizing this object, a first aspect of this invention provides a case for an electronic circuit board mounted with electronic components, comprising: a case main body whose one end is opened; an opening formed at an outer periphery of the open end of the case main body; and retaining means for retaining the electronic circuit board inserted through the open end at a prescribed position in the case main body.

Since the case is formed with an opening at the outer periphery of the open end of the case main body and with the retaining means for retaining the electronic circuit board inserted through the open end at a prescribed position in the case main body, the electronic circuit board can be immobilized at the prescribed position in the case main body and the strength of the case (i.e. case main body), particularly the strength of the open end thereof, can be increased. Moreover, when resin is potted or charged into the case main body, any resin that runs out from the open end can be caused to flow into the opening.

In a second aspect, the present invention provides the case, wherein the opening is provided with a catcher such that resin potted in the case main body is caught by the catcher, when overflowing the open end.

Since the opening is provided with a catcher and any resin potted or charged into the case may body that overflows the open end and runs out to the exterior is caught by the catcher, the resin running out to the exterior of the case main body can be prevented from sticking to the outside of the case main body.

In a third aspect, the present invention provides the case, wherein a notch is formed at a portion of the open end where the case main body and a part of the electronic components are in close proximity with each other.

Since a notch is formed at a portion of the open end where the case main body and a part of the electronic components are in close proximity or in contact with each other, the space (gap) between the case main body and the electronic components concerned is enlarged. Since occurrence of capillary action is therefore inhibited, flow of resin to the exterior of the case main body is reduced.

In a fourth aspect, the present invention provides the case, wherein a rib is formed to interconnect the open end and the catcher across the opening.

Since a rib is formed to interconnect the open end and the catcher across the opening, the strength of the case (i.e., case main body), particularly the strength of the open end thereof, is further increased.

In a fifth aspect, the present invention provides the case, wherein the retaining means comprises at least the resin potted in the case main body, rails formed on an inner wall of the case main body, and a projection formed on a part of the electronic components to engage with a portion of the case main body close to the open end.

Since the retaining means comprises at least the resin potted or charged into the case, rails formed on an inner wall of the case main body, and a projection formed on some of the electronic components to engage with a portion of the case main body close to the open end, the electronic circuit board can be reliably introduced and immobilized at the prescribed position. Resistance of the electronic circuit board against shock and vibration imparted from the exterior is therefore enhanced.

In the sixth aspect, the present invention provides the case, wherein the case main body is formed to have an irregular profile matched to the shape of the electronic components.

Since the case main body is formed to have an irregular profile matched to the shape of the electronic components, the volume of the case (i.e. case main body) can be made small and the amount of potted or charged resin reduced.

BRIEF DESCRIPTION OF THE DRAWINGS

The above and other objects and advantages of the invention will be more apparent from the following description and drawings, in which.

DETAILED DESCRIPTION OF THE PREFERRED EMBODIMENTS

Figure 2:
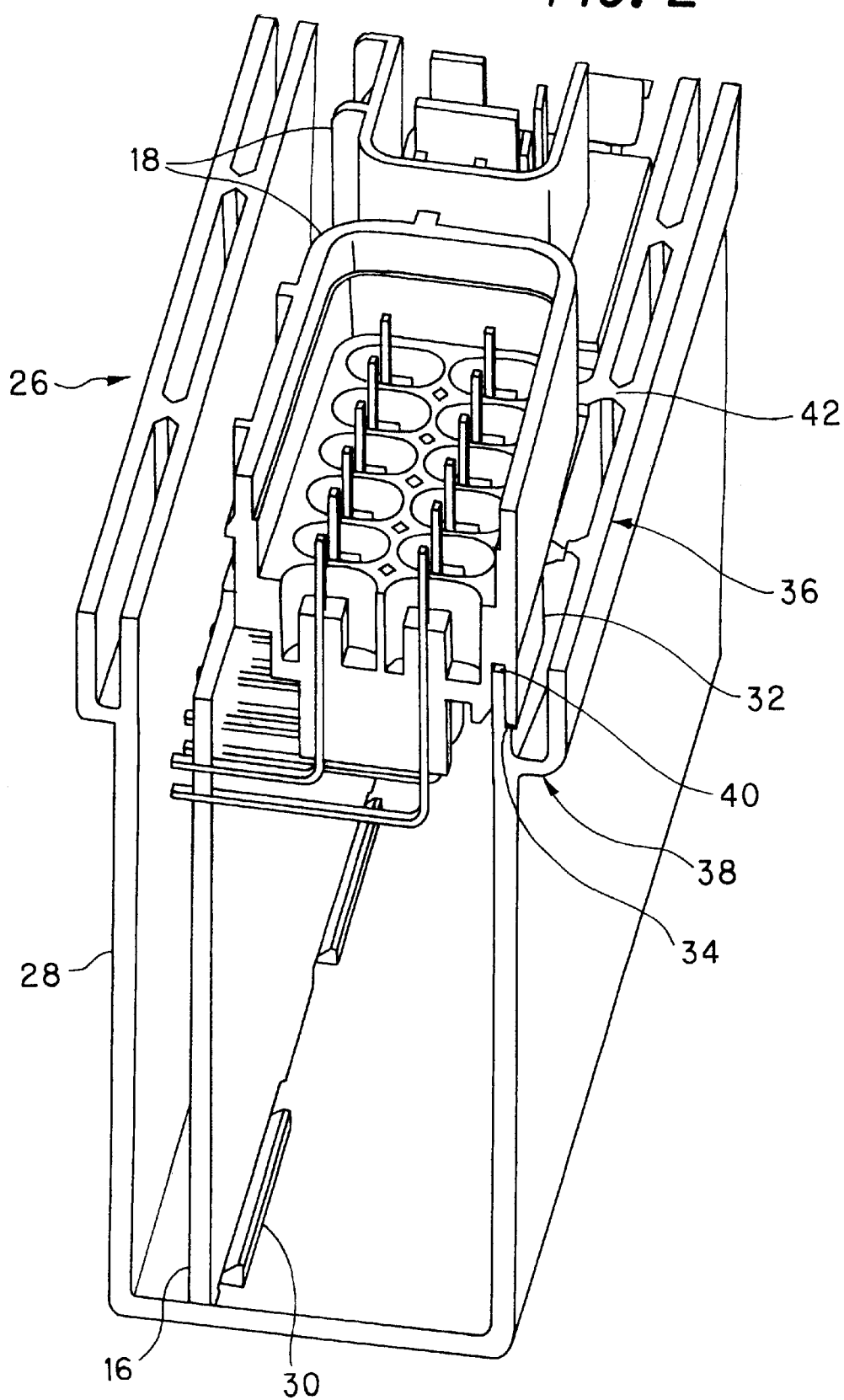
FIG. 2 is a perspective view for explaining the electronic circuit board case according to the first embodiment.
Figure 3:
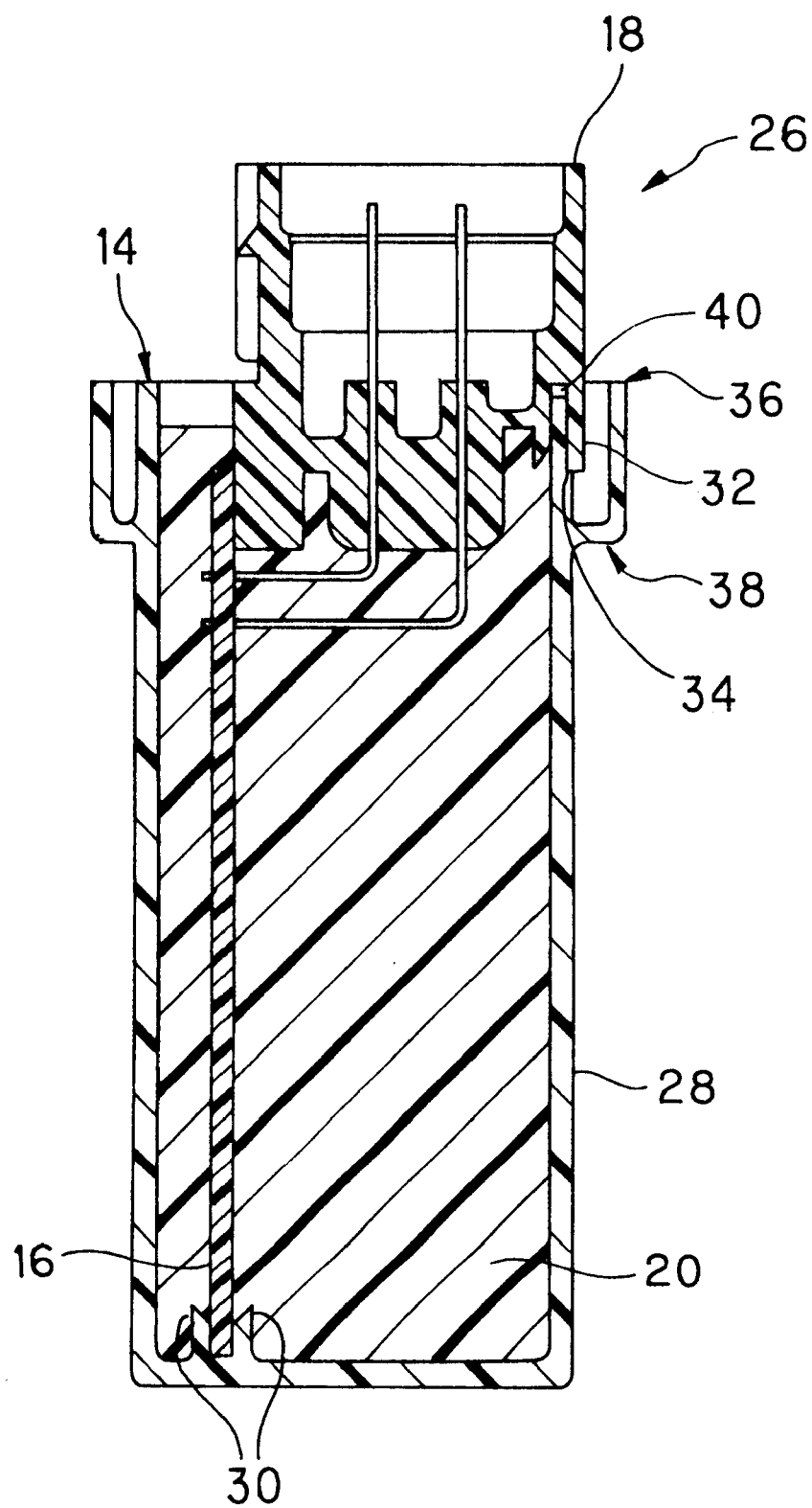
FIG. 3 is a sectional view of the electronic circuit board case according to the first embodiment.

An electronic circuit board case according to an embodiment of the present invention will now be explained with reference to FIGS. 1 to 3. Constituents similar to those of the prior art are assigned like reference symbols and will not be explained again.

Figure 1:
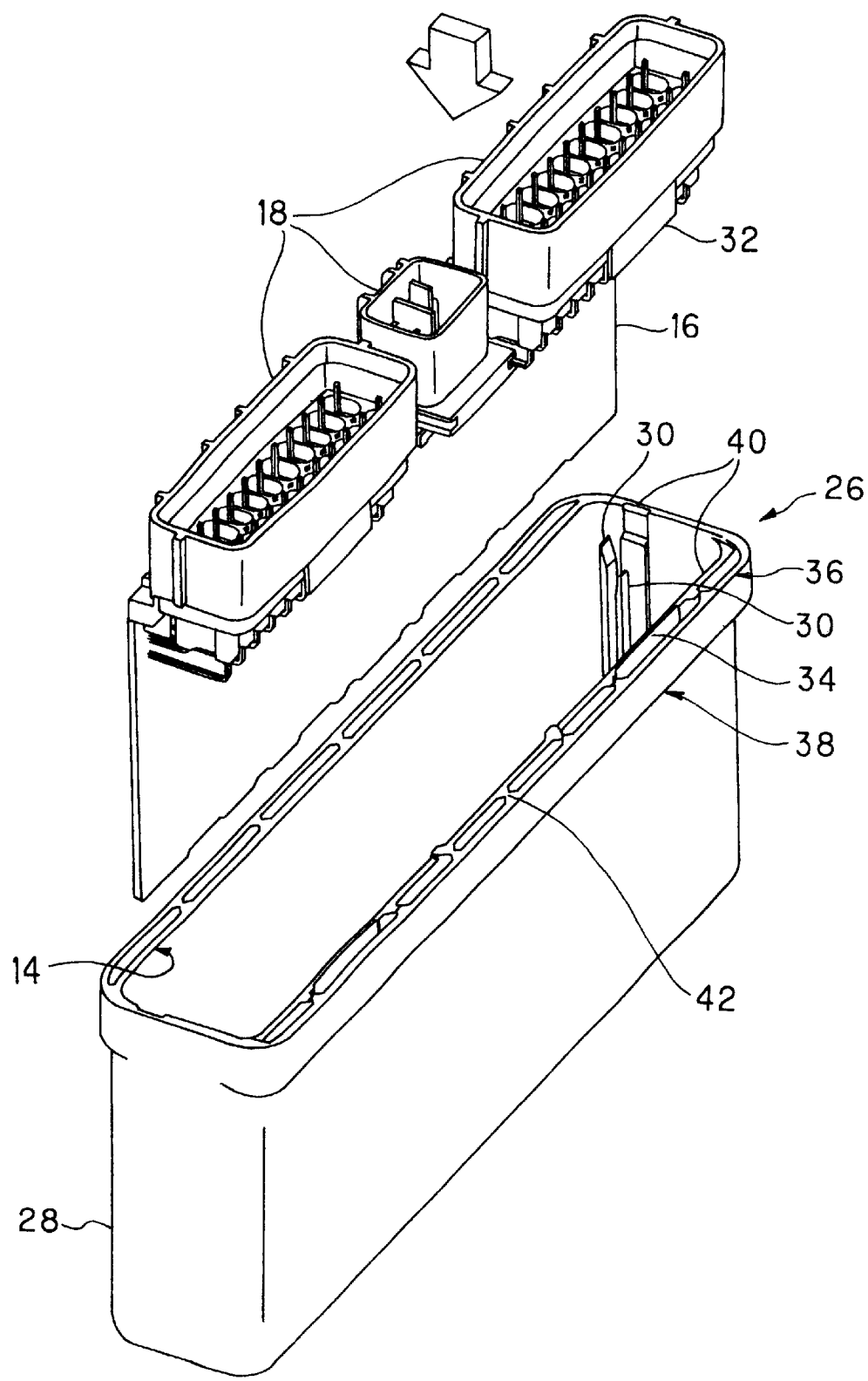
FIG. 1 is a perspective view showing an electronic circuit board case according to a first embodiment of the present invention.

FIG. 1 is a perspective view showing an electronic circuit board case according to a first embodiment of the present invention.

A case 26 comprises a case main body 28 which has the general shape of a rectangular prism, is formed at its top with an open end 14. Rails 30 for guiding an electronic circuit board 16 to, and immobilizing it at, a prescribed position in the case main body 28 are formed on an inner wall of the case main body 28. Specifically, paired rails 30 are formed opposite to each other at appropriate locations on the floor and inner wall of the case main body 28 so as to form grooves of a width substantially equal to the thickness of an electronic circuit board 16. A plurality of recesses 34 for engaging projections 32 (explained next) are formed near the open end 14. A plurality of connectors 18 are mounted on the electronic circuit board 16 by soldering and the projections 32 for engagement with the associated recesses 34 are formed as flange-like members at the bottom of sidewalls of the connectors 18.

The electronic circuit board 16 is fixed at a prescribed position by inserting it into the case main body 28 so as to be held in the case main body 28 by the rails 30, specifically by introducing it into the grooves formed by the paired rails 30. The upper edges of the rails 30 are tapered to facilitate introduction (insertion) of the electronic circuit board 16. In addition, the projections 32 fit into the associated recesses 34. The electronic circuit board 16 and the connectors 18 can therefore be firmly fixed at their prescribed locations.

An opening 36 for inflow of resin 20 (not shown in FIG. 1) overflowing the open end 14 to the outside of the case 26 are formed at the outer periphery of the open end 14. The opening 36 is defined by a plurality of catchers 38 integrally formed for retaining resin 20 that flows into the opening 36. Notches 40 for inhibiting capillary action are formed at portions of the open end 14 where the case main body 28 and the connectors 18 are in close proximity or in contact with each other. A plurality of ribs 42 are formed to interconnect the open end 14 and vertical portions of the catchers 38 across the opening 36 in a manner suitable for increasing the strength of the case main body 28, particularly its open end 14.

A more detailed description will now be made with reference to FIG. 2.

The catchers 38 are formed integrally with the outer periphery of the open end 14 of the case main body 28 in a generally L-like (or reversed L-like) shape so as to define the opening 36. Although not shown in FIG. 2, resin 20 that overflows the open end 14 and runs out to the exterior of the case 26 enters the opening 36 to be retained by the catchers 38. Sticking of resin to the outer surface of the case main body 28 is therefore prevented.

The notches 40 are formed at portions of the open end 14 where the case main body 28 and the connectors 18 are in close proximity or in contact with each other. When, as shown in FIG. 3, the resin 20 is potted or charged up to the vicinity of the open end 14, i.e., up to a level enabling the resin 20 to retain (immobilize) and protect the electronic circuit board 16 and the connectors 18 after it hardens, capillary action arises in the space (gap) between the case main body 28 and the connectors 18.

Since the degree of the capillary action is inversely proportional to the size of the gap, however, the capillary action can be inhibited by formation of the notches 40, i.e., by deliberately enlarging the space between the case main body 28 and the connectors 18. By inhibiting the occurrence of capillary action, it is in turn possible to reduce outflow of the resin 20 to the outside of the case main body 28. Excellent capillary action preventing effect can be obtained with a gap of around 1 mm.

In addition, the strength of the case main body 28, particularly the strength of its open end 14, is increased by forming a number of ribs 42 perpendicularly interconnecting the open end 14 and the vertical portions of the catchers 38 across the opening 36.

Being configured as described in the foregoing, the first embodiment of the present invention provides the electronic circuit board case that, without requiring any increase in number of fabrication steps, can prevent sticking of the resin 20 to the exterior of the case main body 28, is enhanced in the strength of the case main body 28, particularly the strength of the open end 14, and can reliably retain (immobilize) and protect an accommodated electronic circuit board 16 and electronic components (connectors 18 etc.).

An electronic circuit board case according to a second embodiment of the present invention will now be explained.

Figure 4:
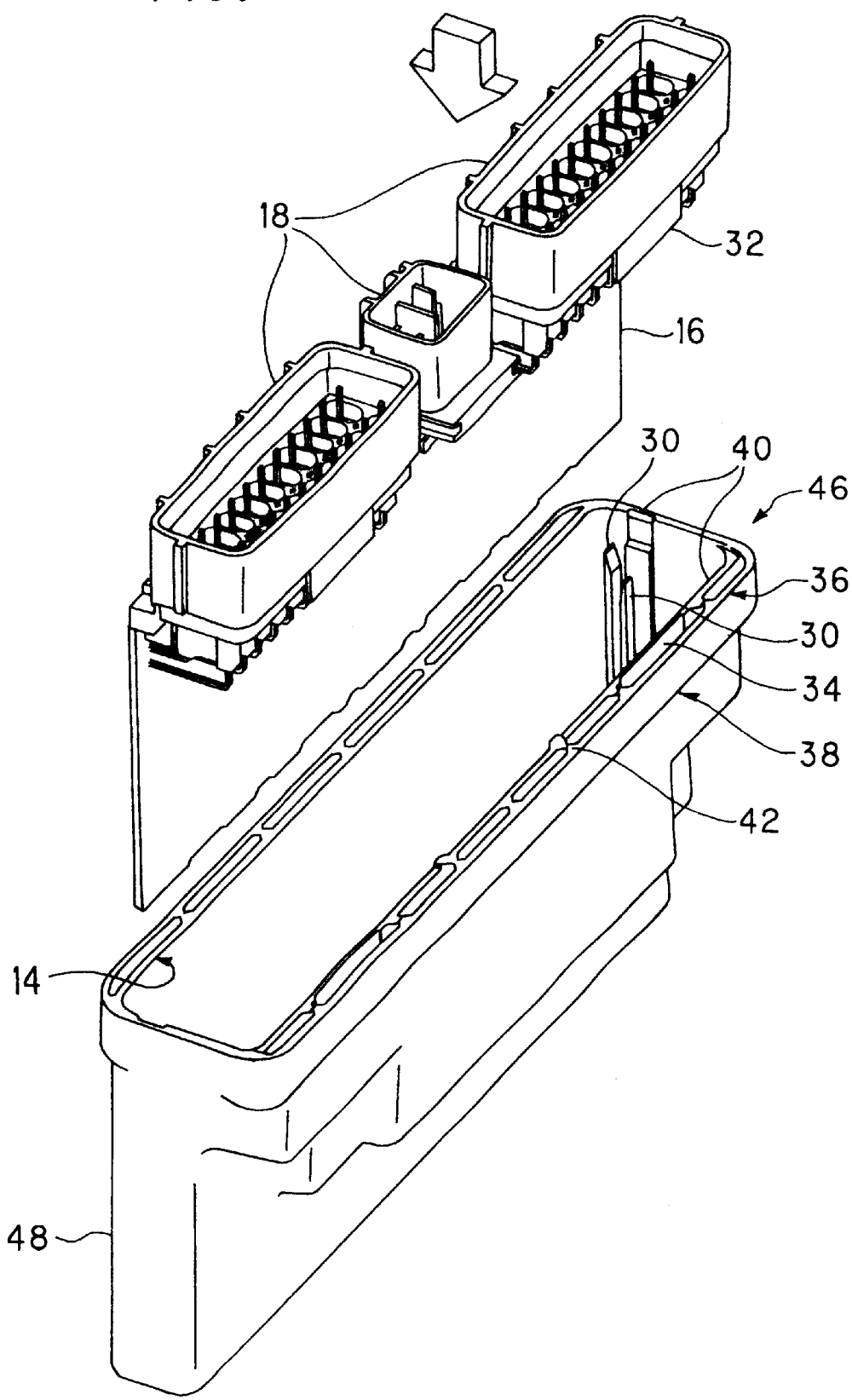
FIG. 4 is a perspective view showing an electronic circuit board case according to a second embodiment of the present invention.
Figure 5:
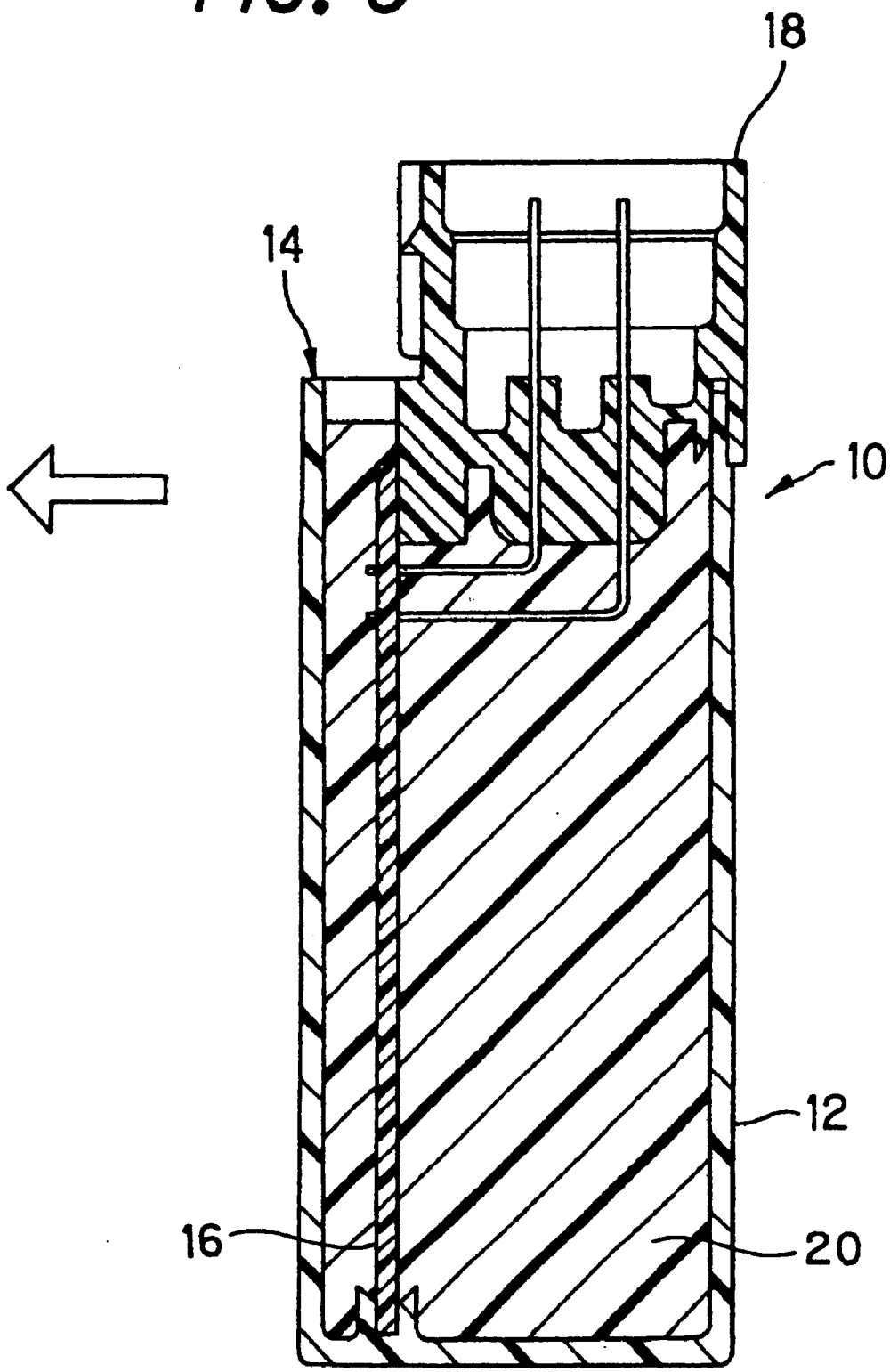
FIG. 5 is a sectional view of an electronic circuit board case according to the prior art.
Figure 6:
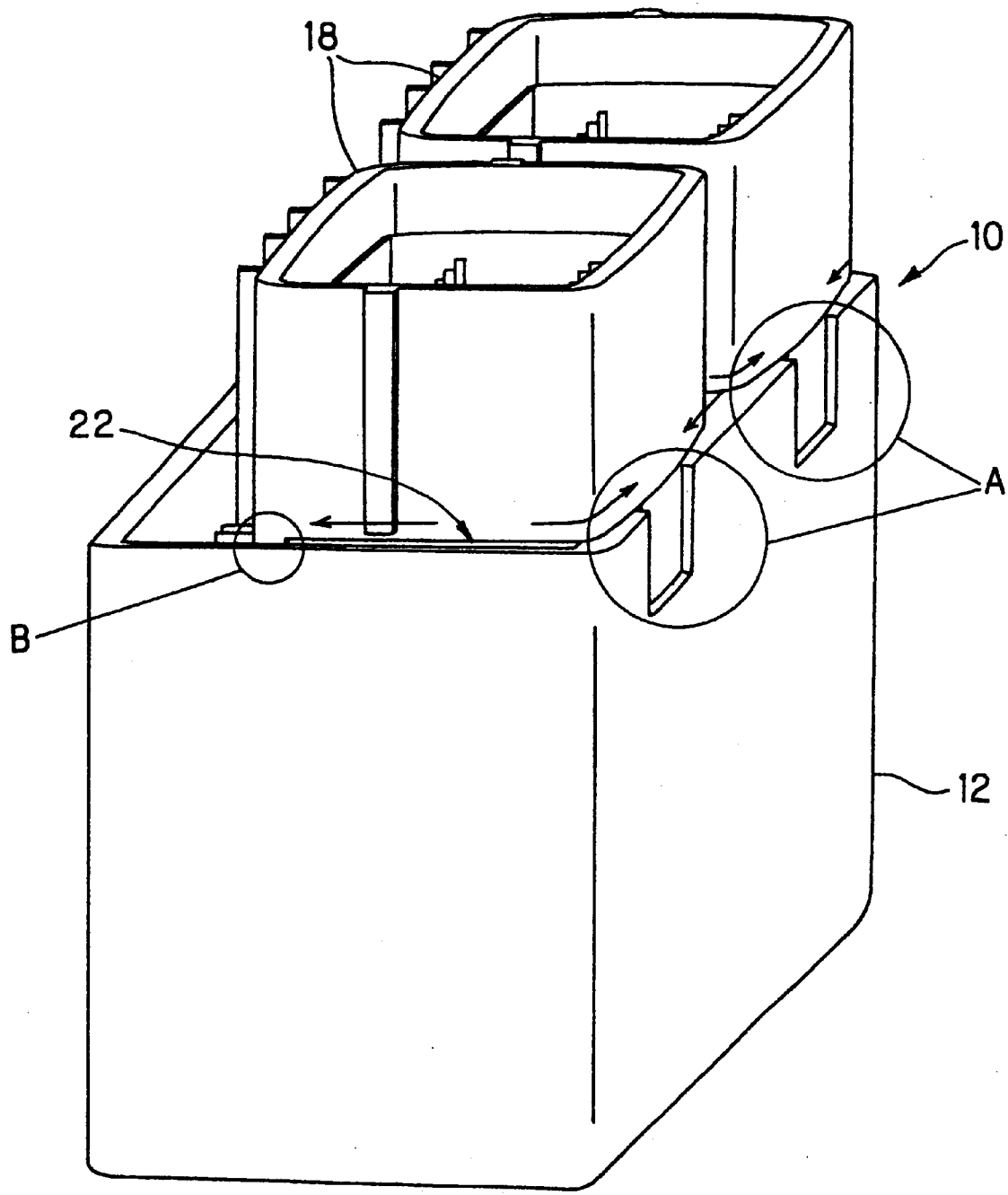
FIG. 6 is a perspective view for explaining resin movement in the electronic circuit board case according to the prior art.

FIG. 4 is a perspective view showing an electronic circuit board case according to a second embodiment of the present invention.

The electronic circuit board case according to the second embodiment of the present invention, designated by reference numeral 46, comprises a case main body 48 that is formed to have an irregular profile matched to the shape of electronic components (not shown) mounted on the electronic circuit board 16. Since the other constituents of the case 46 are the same as those of the case 26, they are denoted by like reference symbols and will not be explained again here.

Being configured as described in the foregoing, the second embodiment of the present invention provides the electronic circuit board case that, in addition to the advantageous effects described above with regard to the first embodiment, further enables the volume of the case main body 48 to be made small and thus reduces the amount of potted or charged resin 20.

Thus, the embodiments are configured to provides a case (26, 46) for an electronic circuit board (16) mounted with electronic components, comprising: a case main body (28, 48) whose one end (14) is opened; an opening (36) formed at an outer periphery of the open end (14) of the case main body; and retaining means (rails 30, projection 32, recess 34) for retaining the electronic circuit board inserted through the open end at a prescribed position in the case main body.

Since the case is formed with an opening at the outer periphery of the open end of the case main body and with the retaining means for retaining the electronic circuit board inserted through the open end at a prescribed position in the case main body, the electronic circuit board can be immobilized at the prescribed position in the case main body and the strength of the case (i.e. case main body), particularly the strength of the open end thereof, can be increased. Moreover, when resin is potted or charged into the case main body, any resin that runs out from the open end can be caused to flow into the opening.

In the case, wherein the opening (36) is provided with a catcher (38) such that resin (20) potted in the case main body is caught by the catcher, when overflowing the open end (14).

Since the opening is provided with a catcher and any resin potted or charged into the case may body that overflows the open end and runs out to the exterior is caught by the catcher, the resin running out to the exterior of the case main body can be prevented from sticking to the outside of the case main body.

In the case, wherein a notch (40) is formed at a portion of the open end where the case main body and a part (connectors 18) of the electronic components are in close proximity with each other.

Since a notch is formed at a portion of the open end where the case main body and a part of the electronic components are in close proximity or in contact with each other, the space (gap) between the case main body and the electronic components concerned is enlarged. Since occurrence of capillary action is therefore inhibited, flow of resin to the exterior of the case main body is reduced.

In the case, wherein a rib (42) is formed to interconnect the open end (14) and the catcher across the opening (36).

Since a rib is formed to interconnect the open end and the catcher across the opening, the strength of the case (i.e., case main body), particularly the strength of the open end thereof, is further increased.

In the case, wherein the retaining means comprises at least the resin (20) potted in the case main body, rails (30) formed on an inner wall of the case main body, and a projection (32) formed on a part of the electronic components to engage with a portion of the case main body close to the open end.

Since the retaining means comprises at least the resin potted or charged into the case, rails formed on an inner wall of the case main body, and a projection formed on some of the electronic components to engage with a portion of the case main body close to the open end, the electronic circuit board can be reliably introduced and immobilized at the prescribed position. Resistance of the electronic circuit board against shock and vibration imparted from the exterior is therefore enhanced.

In the case, wherein the case main body (28, 48) is formed to have an irregular profile matched to the shape of the electronic components.

Since the case main body is formed to have an irregular profile matched to the shape of the electronic components, the volume of the case (i.e. case main body) can be made small and the amount of potted or charged resin reduced.

Although the invention was described with regard to embodiments in which the opening 36 and the catchers 38 are formed only along the long sides of the open end 14, they can instead be formed over the entire outer periphery of the open end 14.

Moreover, the opening 36 and the catchers 38 are not limited to the illustrated shapes but can instead be configured in any of various other shapes enabling inflow and retention of the resin 20.

Although the ribs 42 were described as perpendicularly interconnecting the open end 14 and the vertical portions of the catchers 38 across the opening 36, the invention is not limited to this configuration and the ribs 42 can instead be configured in any of various other ways providing structural reinforcement.

Although the electronic circuit board 16 is secured by two immobilizing means, the rails 30 and the recesses 34, in the described embodiments, provision of only one these means suffices.

Although a plurality of the catchers 38, the ribs 42, etc. are illustrated, only one number of them may sometimes be sufficient. Only one projection 32 may sometimes be sufficient for the associated recess 34.

While the invention has thus been shown and described with reference to specific embodiments, it should be noted that the invention is in no way limited to the details of the described arrangements; changes and modifications may be made without departing from the scope of the appended claims.

What is claimed is:

1. A case for an electronic circuit board mounted with electronic components, comprising:
   a case main body whose one end is opened;
   a catcher, spaced from an outer periphery of the open end of the case main body so as to form an opening between said catcher and said outer periphery; and
   retaining means for retaining the electronic circuit board inserted through the open end at a prescribed position in the case main body; wherein
   resin potted in said case main body is caught by said catcher, when resin is overflowing the open end during curing.

2. A case according to claim 1, wherein at least one notch is formed between the outer periphery and an inner periphery of the open end at a portion (portions) of the open end where the case main body and a part of the electronic components are in close proximity with each other, so as to inhibit capillary action.

3. A case according to claim 1, wherein the retaining means comprises at least the resin potted in the case main body, rails formed on an inner wall of the case main body, and a projection formed on a part of the electronic components to engage with a portion of the case main body close to the open end.

4. A case according to claim 1, wherein the case main body is formed to be closely spaced from the electronic circuit board and mounted electronic components which are inserted in said main body, so as to have an irregular profile matched to the shape of the electronic components.

5. A case for an electronic circuit board mounted with electronic components, comprising:
   a case main body whose one end is opened;
   a catcher, spaced from an outer periphery of the open end of the case main body so as to form an opening between said catcher and said outer periphery; and
   retaining means for retaining the electronic circuit board inserted through the open end at a prescribed position in the case main body; wherein
   a rib is formed across the opening to interconnect the open end and the catcher.

* * * * *